United States Patent
Stoll et al.

(10) Patent No.: US 10,020,292 B2
(45) Date of Patent: Jul. 10, 2018

(54) OPTOELECTRONIC SEMICONDUCTOR COMPONENT AND FLASHLIGHT

(71) Applicant: OSRAM Opto Semiconductors GmbH, Regensburg (DE)

(72) Inventors: Ion Stoll, Tegernheim (DE); David Racz, Regensburg (DE); Markus Schneider, Schoenhofen (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 0 days.

(21) Appl. No.: 15/508,511

(22) PCT Filed: Aug. 27, 2015

(86) PCT No.: PCT/EP2015/069605
§ 371 (c)(1),
(2) Date: Mar. 3, 2017

(87) PCT Pub. No.: WO2016/034480
PCT Pub. Date: Mar. 10, 2016

(65) Prior Publication Data
US 2017/0278829 A1 Sep. 28, 2017

(30) Foreign Application Priority Data

Sep. 3, 2014 (DE) .................. 10 2014 112 681

(51) Int. Cl.
*H01L 29/20* (2006.01)
*H01L 25/075* (2006.01)
(Continued)

(52) U.S. Cl.
CPC ........ *H01L 25/0753* (2013.01); *H01L 33/507* (2013.01); *H01L 33/504* (2013.01);
(Continued)

(58) Field of Classification Search
CPC . H01L 25/0753; H01L 33/507; H01L 33/508; H01L 2924/0002; H01L 33/504;
(Continued)

(56) References Cited

U.S. PATENT DOCUMENTS 6,414,426 B1 * 7/2002 Akashi .................. C09K 11/76
  252/301.4 P
7,404,652 B2 * 7/2008 Ng ........................... F21K 9/00
  257/E25.02
(Continued)

FOREIGN PATENT DOCUMENTS

EP    2549330 A1    1/2013
JP    2006114911 A  4/2006
(Continued)

OTHER PUBLICATIONS

German Search Report based on application No. 10 2014 112 681.5 (6 pages) dated Apr. 30, 2015 (for reference purpose only).
(Continued)

*Primary Examiner* — Thinh T Nguyen
(74) *Attorney, Agent, or Firm* — Viering Jentschura & Partner MBB

(57) ABSTRACT

Optoelectronic semiconductor component includes at least four different light sources each including at least one optoelectronic semiconductor chip, which during operation emit radiation having mutually different color loci in the CIE standard chromaticity diagram, wherein the semiconductor component is designed to emit white or colored light having a variable correlated color temperature during operation.

14 Claims, 11 Drawing Sheets

(51) Int. Cl.
  *H01L 33/50* (2010.01)
  *H04M 1/21* (2006.01)
  *H05B 33/08* (2006.01)
  *H05B 37/02* (2006.01)

(52) U.S. Cl.
  CPC .... *H01L 33/508* (2013.01); *H01L 2924/0002* (2013.01); *H04M 1/21* (2013.01); *H05B 33/0872* (2013.01); *H05B 37/0218* (2013.01)

(58) Field of Classification Search
  CPC ............ H01L 2924/00; H05B 37/0218; H05B 33/0872; H01M 1/21
  USPC ...................... 257/89, 88, 98; 438/22, 28, 46
  See application file for complete search history.

(56) References Cited

U.S. PATENT DOCUMENTS

| | | | |
|---|---|---|---|
| 2003/0095138 | A1 | 5/2003 | Kim et al. |
| 2006/0082679 | A1 | 4/2006 | Chua et al. |
| 2006/0126326 | A1* | 6/2006 | Ng .......................... F21K 9/00 362/231 |
| 2010/0315012 | A1 | 12/2010 | Kim et al. |
| 2010/0320480 | A1 | 12/2010 | Rapoport et al. |
| 2011/0204796 | A1 | 8/2011 | Hong et al. |
| 2011/0277361 | A1* | 11/2011 | Nichol ................. G02B 6/0018 40/541 |
| 2012/0099303 | A1* | 4/2012 | Li ...................... H01L 25/0753 362/231 |
| 2012/0326627 | A1* | 12/2012 | McDaniel, Jr. ...... H05B 33/086 315/294 |
| 2013/0043406 | A1 | 2/2013 | Huignard et al. |
| 2013/0141013 | A1 | 6/2013 | Kodama et al. |
| 2014/0111985 | A1* | 4/2014 | Harbers .................... F21V 9/16 362/231 |
| 2017/0342320 | A1* | 11/2017 | Tsumori ............. C09K 11/7721 |

FOREIGN PATENT DOCUMENTS

| | | |
|---|---|---|
| JP | 2006173622 A | 6/2006 |
| JP | 2008218486 A | 9/2008 |
| JP | 2011222517 A | 11/2011 |
| JP | 2012199218 A | 10/2012 |
| JP | 2012531043 A | 12/2012 |
| JP | 2013519774 A | 5/2013 |
| JP | 2013524532 A | 6/2013 |
| TW | 200625681 A | 7/2006 |
| TW | 201218358 A | 5/2012 |
| WO | 2010108761 A1 | 9/2010 |

OTHER PUBLICATIONS

International Search Report based on application No. PCT/EP2015/069605 (7 pages) dated Nov. 12, 2015 (for reference purpose only).
Taiwanese official notification for the opinion of examination based on application No. 104128772 (7 pages) dated May 22, 2017 (Reference Purpose Only).
Yoshi Ohno, "Calculation of CCT and Duv and Practical Conversion Formula", CORM 2011 Conference, Gaithersburg, Maryland, USA, May 2011.
Mike Wood, "MacAdam Ellipses", ESTA Protocol Magazine, Fall 2010, pp. 15-18.
Japanese Office Action based on application No. 2017-512681 (8 pages + 14 pages German Translation) dated Mar. 12, 2018 (for reference purpose only).

\* cited by examiner

| Fig. 2 | CIE x | CIE y |
|---|---|---|
| 1 (A) | 0,33 | 0,433 |
| 2 (B) | 0,332 | 0,28 |
| 3 (C) | 0,432 | 0,34 |
| 4 (D) | 0,506 | 0,463 |

| Fig. 3b | CIE x | CIE y |
|---|---|---|
| 1 (A) | 0,306 | 0,44 |
| 2 (B) | 0,386 | 0,292 |
| 3 (C) | 0,44 | 0,461 |
| 4 (D) | 0,38 | 0,379 |

| Fig. 6a | CIE x | CIE y |
|---|---|---|
| 1 (A) | 0,322 | 0,336 |
| 2 (B) | 0,450 | 0,470 |
| 3 (C) | 0,550 | 0,420 |
| 4 (D) | 0,500 | 0,350 |

| Fig. 5a | CIE x | CIE y |
|---|---|---|
| 1 (A) | 0,402 | 0,439 |
| 2 (B) | 0,415 | 0,332 |
| 3 (C) | 0,523 | 0,435 |
| 4 (D) | 0,312 | 0,320 |

| Fig. 7a | CIE x | CIE y |
|---|---|---|
| 1 (A) | 0,332 | 0,399 |
| 2 (B) | 0,159 | 0,048 |
| 3 (C) | 0,450 | 0,360 |
| 4 (D) | 0,500 | 0,460 |

| Fig. 7b | CIE x | CIE y |
|---|---|---|
| 1 (A) | 0,322 | 0,399 |
| 2 (B) | 0,332 | 0,251 |
| 3 (C) | 0,710 | 0,289 |
| 4 (D) | 0,500 | 0,460 |

US 10,020,292 B2

OPTOELECTRONIC SEMICONDUCTOR COMPONENT AND FLASHLIGHT

RELATED APPLICATIONS

The present application is a national stage entry according to 35 U.S.C. § 371 of PCT application No.: PCT/EP2015/069605 filed on Aug. 27, 2015, which claims priority from German application No.: 10 2014 112 681.5 filed on Sep. 3, 2014, and is incorporated herein by reference in its entirety.

TECHNICAL FIELD

An optoelectronic semiconductor component is specified. Furthermore, a flashlight including such a semiconductor component is specified.

BACKGROUND

An object to be achieved is that of specifying an optoelectronic semiconductor component, in particular for flashlight applications, whose emission spectrum is flexibly adjustable.

SUMMARY

This object is achieved, inter alia, by an optoelectronic semiconductor component and by a flashlight including the features of the independent patent claims. The dependent claims relate to preferred developments.

In accordance with at least one embodiment, the optoelectronic semiconductor component includes at least one first light source, at least one second light source, at least one third light source and at least one fourth light source. The light sources differ from one another with regard to their emission spectrum. In other words, the optoelectronic semiconductor component includes four or more than four mutually different light sources. Each light source has a specific emission spectrum.

In accordance with at least one embodiment, each of the light sources of the semiconductor component has one or a plurality of optoelectronic semiconductor chips. By way of example, the semiconductor chips are light-emitting diode chips or laser diode chips.

In accordance with at least one embodiment, the at least four different light sources in each case emit radiation having mutually different colour loci during operation. The colour loci are colour loci in the CIE standard chromaticity diagram. The representation can be implemented for example in a CIE xy diagram, in a CIE uv diagram or in a CIE u'v' diagram. The individual, different CIE representations can be converted into one another, for example as can be gathered from the document Y. Ohno, "Calculation of CCT and Duv and practical conversion formula", CORM Conference 2011, Gavensburg, Md., USA, 3-5 May 2011, and from the document US 2003/0095138 A1. The disclosure content of these documents with regard to the CIE standard chromaticity diagram is incorporated by reference.

In accordance with at least one embodiment, at least two of the colour loci of the radiation spectra emitted by the light sources during operation lie in the CIE standard chromaticity diagram on a common isotherm. It is likewise possible for said colour loci to lie on a common extension straight line which extends an isotherm. In this case, isotherms are lines which lie in the CIE uv diagram perpendicular to the black body curve, also referred to as the Planckian locus, see also for example the Ohno document, page 5. An isotherm is at a distance from the Planckian locus of at most 0.05 unit. In other words, the isotherms end at a distance of 0.05 unit from the Planckian locus, in CIE uv representation or else in CIE xy representation. The extension straight lines extend beyond the associated isotherms, in both directions away from the Planckian locus.

In accordance with at least one embodiment, at least two colour loci lie on the common isotherm or the common extension straight line with a tolerance of at most one three-step MacAdam ellipse. In this case, a one-step MacAdam ellipse is a region within which a standard observer cannot ascertain a colour difference in the CIE standard chromaticity diagram. The concept of the MacAdam ellipses is explained for example in the document M. Wood, "MacAdam Ellipses", ESTA Protocol Magazine, Autumn 2010, pages 15 to 18. The disclosure content of said document with regard to the MacAdam ellipses is incorporated by reference.

In accordance with at least one embodiment, the semiconductor component is designed to emit coloured light or white light having a variable correlated colour temperature, also designated as CCT for short, during operation. White light means, in particular, that a colour locus of the radiation emitted overall by the semiconductor component is then at a distance of at most 0.05 unit or 0.03 unit or 0.01 unit or of at most one five-step MacAdam ellipse or at most one three-step MacAdam ellipse from the Planckian locus in the CIE uv representation. In other words, the semiconductor component during intended use emits light which appears white to an observer. The mixed radiation emitted by the semiconductor component is adjustable in a targeted manner and reproducibly.

In at least one embodiment, the optoelectronic semiconductor component includes at least four different light sources each having at least one optoelectronic semiconductor chip. During operation, the light sources emit radiation having mutually different colour loci in the CIE standard chromaticity diagram. Advantageously, at least two of the colour loci lie in the CIE standard chromaticity diagram on a common isotherm or on a common extension straight line which extends an isotherm. The colour loci then lie on the isotherm or the extension straight line with a tolerance of at most one three-step MacAdam ellipse. The semiconductor component is additionally advantageously designed to emit white light during operation, wherein a colour temperature of the white light is variable and tuneable.

In flashlight applications, for instance in mobile telephones and portable cameras, in photography the actual flashlight often mixes with ambient light. Since there are a large number of different types of ambient light, such as different times of day or different artificial illuminations for instance by fluorescent lamps or energy saving lamps, a considerable improvement in a white balance and an image quality is attained if the light of the flashlight is adapted to the ambient light. This typically cannot be achieved by means of an individual light source or by an individual light-emitting diode, LED for short, but rather must generally be achieved by means of two or several light sources or LEDs together with associated phosphors.

One possibility for realizing light sources which emit different light consists in guiding the light path of a plurality of semiconductor chips in the semiconductor component through different phosphors and/or different phosphor quantities. As a result of the mixing of the light of the individual light sources in different ratios, it is possible to achieve a multiplicity of different colour loci of the radiation emitted overall with the semiconductor component, without additional light sources being required. This leads to a considerable improvement in the image quality.

An efficiency and/or a colour rendering quality can be improved in particular compared with LED components including only two or three semiconductor chips with assigned phosphor and/or having different emission wavelengths. In this regard, a reabsorption of radiation that has already been converted in a phosphor can be reduced since different phosphors having a reabsorbing action can be distributed among and positioned on different semiconductor chips. Since at least two of the colour loci lie on a common isotherm or extension straight line, during operation on the part of only two of the light sources it is possible to realize a chosen colour locus on the Planckian locus in a brightness-optimized manner with low control outlay. By way of example, the isotherm is in the colour temperature range of at least 1000 K or 2300 K or 3000 K and/or is at most 20 000 K or 10 000 K or 7500 K or 5000 K.

As already indicated above, the term isotherms relates in particular to the uv diagram in the CIE 1960 colour space, wherein this colour space can be converted into the other CIE colour spaces. Hereinafter, all indications concerning colour loci, unless indicated otherwise, should be understood with a tolerance of at most one five-step MacAdam ellipse or three-step MacAdam ellipse or one-step MacAdam ellipse.

In accordance with at least one embodiment, two, three, four or more than four of the light sources include at least one semiconductor chip which emits blue light. By way of example, a dominant wavelength and/or centroid wavelength of the blue light is at least 400 nm or 420 nm or 435 nm and/or at most 500 nm or 485 nm or 460 nm.

In accordance with at least one embodiment, three or four or more than four of the light sources in each case include a phosphor mixture. The phosphor mixture includes one or a plurality of phosphors. The phosphor mixture is disposed downstream of the associated semiconductor chip, in particular only this semiconductor chip.

In accordance with at least one embodiment, the phosphor mixture for at least one portion of the semiconductor chips or for all of the semiconductor chips is designed in each case only for a partial conversion of radiation emitted by the associated semiconductor chip. If the semiconductor chip then emits blue light, for example, this blue light is only partly converted into light having a longer wavelength by the phosphor mixture and part of the blue light passes through the phosphor mixture and is emitted.

In accordance with at least one embodiment, the two colour loci are situated on the isotherm or the extension straights line on different sides of the Planckian locus in the CIE xy standard chromaticity diagram. In particular, these two colour loci thus have a $c_y$-coordinate which has firstly a larger value and then a smaller value than the Planckian locus, relative to the associated colour temperature.

In accordance with at least one embodiment, the four colour loci lie in pairs on isotherms or extension straight lines. That is to say that two colour loci lie on a first isotherm or extension straight line and the two further colour loci lie on a second isotherm or extension straight line. The first isotherm or extension straight line has a temperature of advantageously at least 1000 K or 2300 K and/or of at most 5000 K or 4500 K. The second isotherm or extension straight line advantageously exhibits a temperature of more than 4500 K or more than 5000 K and/or of at most 20 000 K or 7500 K.

In accordance with at least one embodiment, the two colour loci which are situated on the isotherm or the extension straight line are situated equally far away from the Planckian locus, in particular in CIE uv representation. If the colour loci are arranged in this way, then especially during equally intensive operation of the two associated light sources it is possible to achieve a resulting colour locus of mixed radiation on the Planckian locus, without relatively great control outlay.

In accordance with at least one embodiment, three or four or all of the colour loci are at a distance from the Planckian locus, in particular in CIE uv representation, of at most 0.04 unit or 0.03 unit or 0.02 unit in the CIE standard chromaticity diagram. In other words, it is possible for three or four or all of the colour loci of the individual light sources already to represent white light. Alternatively, it is possible for two or three or four of the colour loci of the light sources to represent coloured light and thus not to represent white light.

In accordance with at least one embodiment, two or three or all of the colour loci do not lie on the Planckian locus. That is to say, in particular, that a distance between these colour loci and the Planckian locus, for example in CIE xy representation and/or in CIE uv representation, is at least 0.03 unit or 0.05 unit or 0.08 unit or 0.11 unit.

In accordance with at least one embodiment, two of the colour loci lie on the Planckian locus, in particular with a tolerance of at most 0.02 unit or 0.015 unit in the CIE standard chromaticity diagram. The two colour loci which lie on the isotherm or the extension straight line and/or do not lie on the Planckian locus, with regard to their CIE x-coordinate, are situated between the two colour loci on the Planckian locus. In particular, the four colour loci then span a quadrilateral in the CIE xy representation whose longitudinal axis lies above or below the Planckian locus or forms a chord with respect to the Planckian locus. The longitudinal axis of the quadrilateral is longer, for example by at least a factor of 1.5 or 2 or 2.5 and/or by at most a factor of 6 or 4 or 3, than a short axis of the quadrilateral that can be oriented perpendicularly or approximately perpendicularly to the longitudinal axis. The longitudinal axis is intersected by the short axis either in a third having the smallest CIE x-coordinates or in a middle third or in a third having the largest CIE x-coordinates. The intersection point advantageously lies in the middle third.

In accordance with at least one embodiment, the two colour loci which lie on the isotherm or the extension straight line and/or do not lie on the Planckian locus lie nearer by at least 0.04 unit or 0.06 unit or 0.08 unit to the colour locus having the largest CIE x-coordinate than to the colour locus having the smallest CIE x-coordinate. In other words, one of the colour loci then has a comparatively small CIE x-coordinate and three of the colour loci have a similar, relatively large CIE x-coordinate differing by at most 0.08 or 0.04 unit, for example.

In accordance with at least one embodiment, the two colour loci having the largest CIE x-coordinate lie on the Planckian locus, in particular with a tolerance of at most 0.02 unit or 0.015 unit or 0.01 unit. The two colour loci which lie on the isotherm or the extension straight line and/or do not lie on the Planckian locus have in each case smaller or in each case larger CIE x-coordinates than the two colour loci on the Planckian locus. It is possible for only a triangle to be spanned by the four colour loci, wherein the a vertex of said triangle points either towards large CIE x-coordinates or towards small CIE x-coordinates. The colour locus which is situated within the spanned triangle advantageously lies with a tolerance of at most 0.04 unit or 0.02 unit or 0.01 unit in an area centroid of the spanned triangle, in particular in CIE xy representation. A maximum longitudinal extent of the spanned triangle, along the x-direction, advantageously exceeds a maximum transverse extent of the triangle, along the y-direction, by at least a factor of 1.2 or 1.5 or 1.75 and/or by at most a factor of 3 or 4 or 2.

In accordance with at least one embodiment, a first of the colour loci has a CIE x-coordinate of at least 0.2 and/or at most 0.3 and a CIE y-coordinate of at least 0.15 and/or at most 0.4.

In accordance with at least one embodiment, a second of the colour loci lies at a CIE x-coordinate of at least 0.45 or 0.5 and at a CIE y-coordinate of at least 0.25 and/or at most 0.38.

In accordance with at least one embodiment, a third of the colour loci has a CIE y-coordinate of at least 0.40 and/or at most 0.50. In this case, the CIE x-coordinate of the third colour locus is advantageously established between the CIE x-coordinates of the first and second colour loci.

In accordance with at least one embodiment, a fourth of the colour loci has a CIE x-coordinate which deviates from the CIE x-coordinate of the third colour locus by at most 0.05 or 0.02. A CIE y-coordinate of the fourth colour locus is in this case smaller than the CIE y-coordinate of the third colour locus by at least 0.04 or 0.06 and/or by at most 0.15 or 0.10.

In accordance with at least one embodiment, two or three or four or all of the light sources are electrically driveable independently of one another. That is to say that an intensity of the light emitted by the associated light sources is then adjustable independently of the intensity of the other light sources.

In accordance with at least one embodiment, the two light sources having the colour loci lying on the isotherm or the extension straight line are interconnected in the semiconductor component such that they are operated with at least 50% or 75% or 85% of a maximum power. In this case, maximum power denotes that power with which the light sources can be operated precisely still as intended and without reduction of their lifetime.

In accordance with at least one embodiment, the white light spectrum emitted by the semiconductor component during operation has exactly one intensity maximum in the spectral range of between 480 nm and 700 nm, said intensity maximum advantageously not lying at the limits but rather within this spectral range. In particular, the individual light sources are interconnected in the semiconductor component in such a way that during intended use, operation of the semiconductor component is not possible, and so this condition is not met.

In accordance with at least one embodiment, at least one or, advantageously, exactly one of the light sources includes a semiconductor chip which emits near-infrared radiation during operation. This at least one semiconductor chip advantageously has a wavelength of maximum intensity of at least 800 nm or 850 nm and/or at most 1500 nm or 1300 nm or 950 nm. Advantageously, at least one phosphor for converting part of the near-infrared radiation into visible light is disposed downstream of this semiconductor chip which emits in the infrared. In this case, for example, at least 30% or 50% or 70% of the radiation power of this light source, measured in watts, is at wavelengths of 730 nm or more or 750 nm or more. Use of such a light source which emits near-infrared radiation and also visible radiation enables, in particular by means of the near-infrared portion, a 3D scanning of an object to be captured.

Alternatively, it is also possible for a semiconductor chip which emits near-infrared radiation to be used with no phosphor disposed downstream thereof. That is to say that the corresponding light source then emits for example exclusively near-infrared light and no visible light.

In accordance with at least one embodiment, one of the light sources includes a semiconductor chip which emits coloured light and downstream of which a phosphor for generating near-infrared radiation is disposed. By way of example, the associated semiconductor chip then emits blue light and/or green light and/or red light. A wavelength of maximum intensity of the radiation emitted by the phosphor is advantageously at least 750 nm and/or at most 850 nm or 900 nm. For example, at least 30% or 50% or 70% of the radiation power of this light source, measured in watts, is at wavelengths of at least 730 nm or 750 nm.

In accordance with at least one embodiment, two or three or four or all of the colour loci of the light sources have a colour saturation of at least 10% or 20% and/or at most 90% or 80% or 50%. In other words, at least one portion of the light sources then has a colour locus with a comparatively low colour saturation. It is possible for light sources having a low colour saturation to be used in combination with light sources having a high colour saturation, for example of at least 60% or 80% or 85%. By way of example, in that case, three of the light sources have a low colour saturation and one of the light sources has a high colour saturation.

In accordance with at least one embodiment, the colour loci on the common isotherm or extension straight line in each case do not lie on the Planckian locus. Alternatively, one of these colour loci, too, can lie on the Planckian locus.

Furthermore, a flashlight is specified. The flashlight includes one or a plurality of the optoelectronic semiconductor components as specified in association with one or a plurality of the embodiments mentioned above. Features of the flashlight are therefore also disclosed for the optoelectronic semiconductor component, and vice versa.

In at least one embodiment, the flashlight is incorporated in a portable telecommunications device, for example in a mobile telephone or a tablet.

In accordance with at least one embodiment, the flashlight includes an ambient light sensor. In particular, a colour temperature of the ambient light can be ascertained by means of the ambient light sensor. With the aid of the ambient light sensor it is possible for the light emitted by the flashlight to be adapted to the ambient light with regard to the colour temperature, for example with a tolerance of at most 20% or 10% or 5% of the correlated colour temperature of the ambient light. This adaptation can be carried out manually or else automatically.

BRIEF DESCRIPTION OF THE DRAWINGS

An optoelectronic semiconductor component described here is explained in greater detail below on the basis of exemplary embodiments with reference to the drawing. In this case, identical reference signs indicate identical elements in the individual figures. However, relations to scale are not illustrated; rather, individual elements may be illustrated with an exaggerated size in order to afford a better understanding.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 9 shows a table with colour loci of exemplary embodiments described here.

DETAILED DESCRIPTION

Figure 1:
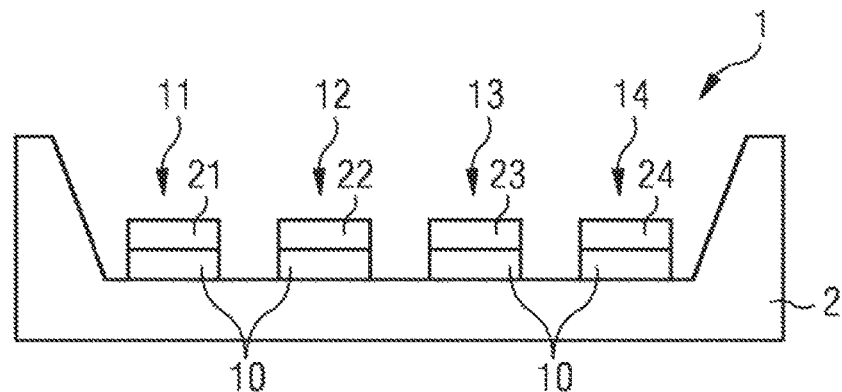
FIG. 1 shows schematic sectional illustrations of exemplary embodiments of optoelectronic semiconductor components described here.
Figure 1:
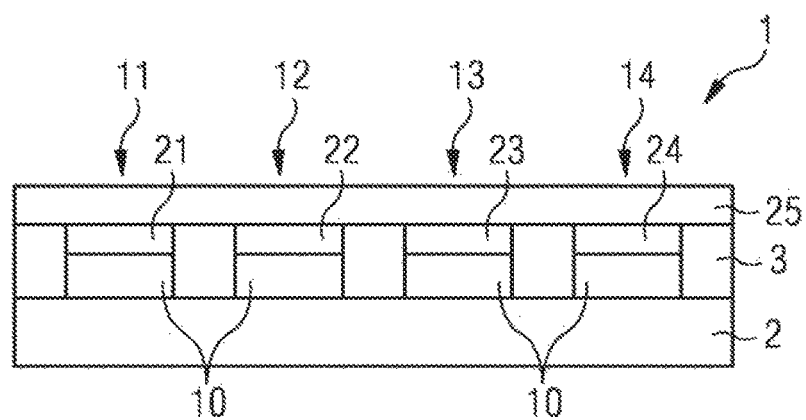
Figure 1:
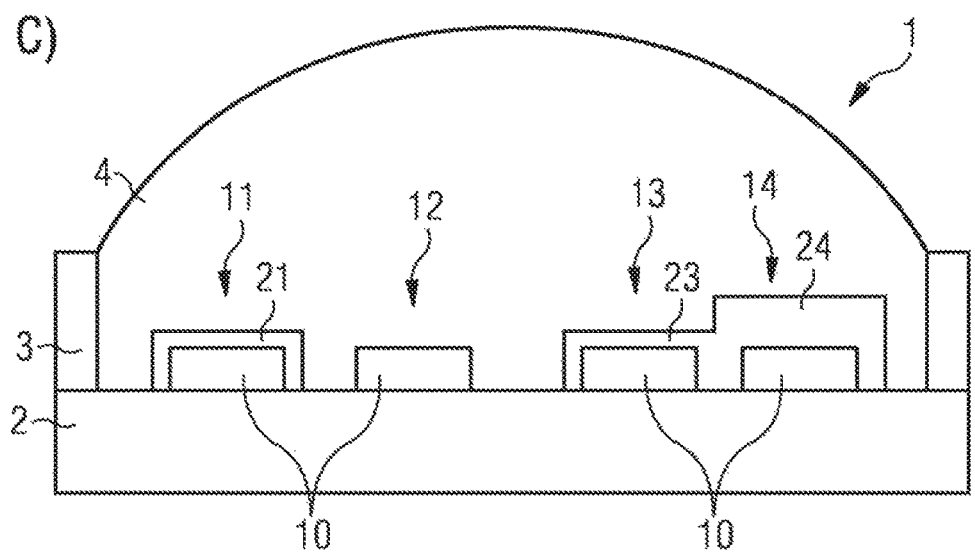
Figure 2:
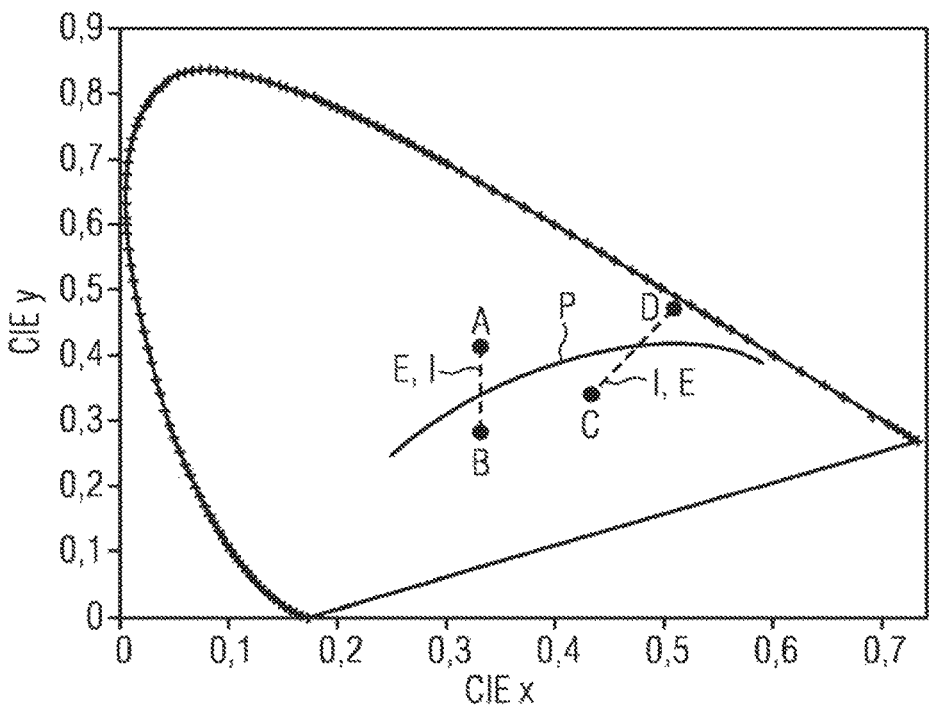
FIGS. 2 to 7 show schematic illustrations of the spectral properties of radiation of exemplary embodiments of optoelectronic semiconductor components described here.
Figure 2:
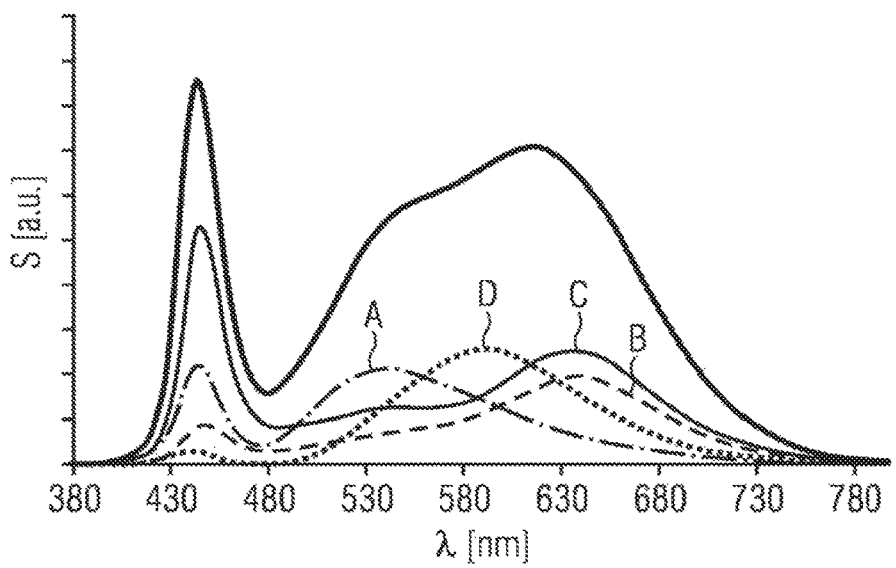

FIG. 1 shows several possibilities for realizing an optoelectronic semiconductor component 1 including four light sources 11, 12, 13, 14. In the figures, the light sources 11, 12, 13, 14 are provided in each case only with a single semiconductor chip 10, which can be a light-emitting diode chip. In a departure therefrom, each of the light sources 11, 12, 13, 14 may also include a plurality of the optoelectronic semiconductor chips 10. Likewise, in order to simplify the illustration, the semiconductor chips 10 and the light sources 11, 12, 13, 14 are illustrated in each case in a manner arranged linearly in a chain. As an alternative thereto, it is also possible to choose matrix-shaped arrangements as seen in plan view. Furthermore, electrical connections, electrical connecting lines and possible further electronic components such as radiation sensors or protective devices for protection against damage from electrostatic discharges are in each case not depicted in the figures. The light sources 11, 12, 13, 14 are electrically driveable independently of one another, drive electronics not being depicted.

In accordance with FIG. 1A the semiconductor chips 10 are arranged on a carrier 2 in a trough, which can be of reflective design. A phosphor mixture 21, 22, 23, 24 is disposed downstream of each of the light sources 11, 12, 13, 14. In this case, it is possible for a plurality of light sources to have the same phosphor mixture in each case only in different concentrations and/or mixing ratios.

In accordance with FIG. 1B, the carrier 2 is fashioned with planar main sides opposite one another. The semiconductor chips 10 and the phosphor mixtures 21, 22, 23, 24 are optionally surrounded all around by a potting 3. The potting 3 is advantageously reflective for the radiation generated during the operation of the semiconductor component 1. By way of example, the potting 3 is a silicone material to which are reflective particles, for instance composed of titanium added dioxide. Such a potting 3 can also be present in all the other exemplary embodiments.

Furthermore, the semiconductor component 1, as shown in FIG. 1B, includes a further layer 25. The further layer 25 is disposed downstream of all the light sources 11, 12, 13, 14 jointly. As an alternative or in addition to a phosphor mixture, the layer may also include light-scattering particles in order to ensure a more homogeneous colour impression. The layer 25 likewise makes it possible that, for example, a yellow colour impression of the phosphor mixtures 21, 22, 23, 24 is concealed through to a white colour impression in the switched-off state of the semiconductor component 1. Such a further layer 25 can be present in all the other exemplary embodiments.

FIG. 1C illustrates that the phosphor mixtures 21, 23, 24 are not embodied as laminae, as in FIGS. 1A and 1B, but rather as potting bodies. In this case, one of the light sources 12 is free of a phosphor mixture. By way of example, the light source 12 then emits blue or blue-green light. It is likewise possible for a conversion medium for wavelength conversion of, for example, blue light already to be monolithically integrated within the semiconductor chip 10 of the light source 12.

The phosphor mixture 21 is embodied in a cap-like fashion and surrounds the semiconductor chip 10 of the light source 11 with a constant layer thickness. The two semiconductor chips 10 of the light sources 13, 14 are surrounded by a common phosphor mixture 23, 24. In this case, the semiconductor chip 10 of the light source 14 is surrounded by a larger layer thickness of the phosphor mixture 23, 24.

A ring-shaped body 3 is formed on the flat carrier 2 of the semiconductor component 1, as shown in FIG. 1C. Instead of a potting, the body 3 can be shaped by a ring applied for example by adhesive bonding, for instance composed of a silicone. Optionally, as also in all the other exemplary embodiments, an optical unit 4 shaped as a lens, for example, is situated within the body 3. The optical unit 4 may optionally include a scattering medium, for instance light-scattering particles, and/or a further phosphor.

The spectral emission properties of total radiation which is emitted by the optoelectronic semiconductor component 1 and by the light sources 11, 12, 13, 14 are illustrated schematically below. The respective emission properties can be realized with all the semiconductor components 1 shown in association with FIG. 1.

In FIGS. 2 to 6, the different colour loci of the radiation emitted by the light sources 11, 12, 13, 14 are designated by the letters A, B, C, D. The Planckian locus of the CIE standard chromaticity diagram is designated by P. If spectra are illustrated, then an intensity S in arbitrary units, a.u. for short, is plotted against a wavelength λ in nm. The emission spectra associated with the light sources are, if shown, denoted by the letter A, B, C, D associated with the colour loci.

In accordance with FIG. 2A, the colour loci A, B lie on an extension straight line E of an isotherm I. The colour loci A, B lie on different sides of the Planckian locus P. Therefore, a $c_y$-coordinate of the colour locus A is greater than that of the Planckian locus P having the corresponding colour temperature, which is in turn greater than the $c_y$-coordinate of the colour locus B. A correlated colour temperature with respect to the colour loci A, B is advantageously at least 5000 K and at most 20 000 K.

The two colour loci C, D also lie on a common extension straight line E of an isotherm I having a correlated colour temperature in the range of 2000 K to 8000 K, advantageously in the range of 2300 K to 5000 K, and lie on different sides of the Planckian locus P. A distance between the colour loci A, B and the Planckian locus P is approximately identical. The distance between the colour locus D and the Planckian locus P is less than that for the colour locus C, which has the smaller $c_y$-coordinate. Therefore a quadrilateral is spanned by the colour loci A, B, C, D, in CIE xy representation.

The light sources for the colour loci A, B, C, D are advantageously excited by structurally identical semiconductor chips with a wavelength of maximum intensity in the range of at least 380 nm to at most 480 nm, as also possible in all the other embodiments. In a departure therefrom, semiconductor chips with different wavelengths of maximum intensity can also be used. In accordance with FIG. 2B, the excitation wavelength is approximately 445 nm.

The phosphors specified in the document EP 2 549 330 A1 can be used as phosphors, for example. With regard to the phosphors used, the disclosure content of said document is incorporated by reference.

The colour locus A can be generated for example by a semiconductor chip which emits in the range of 380 nm to 480 nm (peak wavelength or wavelength of maximum intensity), and one or a plurality of phosphors in the associated light path. A phosphor of the formula $Y_3(Al_{x-1}Ga_x)_5O_{12}:Ce^{3+}$ or else a mixture of a plurality of phosphors of the formula $Y_3(Al_{x-1}Ga_x)_5O_{12}:Ce^{3+}$ is advantageously used for this purpose. The dominant wavelength of this phosphor material is, in particular, in the range of 572 nm to 575 nm.

The colour locus of this phosphor material (not depicted), at an excitation wavelength of approximately 460 nm, is advantageously in the range of $c_x$=0.453 to 0.469 and $c_y$=0.532 to 0.520. Alternatively or additionally, a phosphor of the formula $(Lu_{y-1},Y_y)_3(Al_{x-1}Ga_x)_5O_{12}:Ce^{3+}$ or a mixture of a plurality of such phosphors can also be used for the colour locus A. The dominant wavelength of such a phosphor material is advantageously (at an excitation wavelength of approximately 460 nm) in the range of 558 nm to 562 nm. The colour locus of this phosphor material (not depicted) is advantageously (excitation wavelength=460 nm) in the range of $c_x$=0.356 to 0.374 and $c_y$=0.561 to 0.573. These materials can optionally also be mixed proportionally <20% with one of the following phosphors: $Eu^{2+}$-doped nitrides, for example $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$. The dominant wavelength of the nitridic phosphor material is advantageously (excitation wavelength=460 nm) in the range of 590 nm to 615 nm, particularly advantageously in the range of 596 nm to 604 nm. The colour locus of the nitridic phosphor material (not depicted) is for example (excitation wavelength=460 nm) in the range of $c_x$=0.608 to 0.639 and $c_y$=0.360 to 0.390.

The colour loci B and C are generated for example by a semiconductor chip which emits in the range of 380 nm to 480 nm (peak wavelength), and downstream of which one or a plurality of phosphors are arranged in the light path. A phosphor or a mixture of phosphors having a dominant wavelength in the range of 580 nm to 650 nm is advantageously used for this purpose. Said phosphors can be selected for example from the following material systems: $Eu^{2+}$-doped nitrides, for example $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$. Advantageously, these phosphors are additionally mixed with a greenish and/or yellow phosphor, for example from the following material systems: $Lu_3(Al_{1-x}Ga_x)_5O_{12}:Ce^{3+}$, $Y_3(Al_{1-x}Ga_x)_5O_{12}:Ce^{3+}$, $Eu^{2+}$-doped sulphides, $(Ba,Sr,Ca)Si_2O_2N_2:Eu^{2+}$, SiAlONs, nitrido-orthosilicates such as $AE_{2-x-a}RE_xEu_aSi_{1-y}O_{4-x-2y}N_x$ where RE=rare earth metal and AE=alkaline earth metal, orthosilicates such as $(Ba,Sr,Ca)_2SiO_4:Eu^{2+}$, chlorosilicates such as $Ca_8Mg(SiO_4)_4Cl_2:Eu^{2+}$.

The colour locus D can be generated for example by a semiconductor chip which emits in the range of 380 nm to 480 nm (peak wavelength), together with one or a plurality of phosphors in the light path. A $Y_3(Al_{1-x}Ga_x)_5O_{12}:Ce^{3+}$ or a mixture of a plurality of such phosphors is used for this purpose, for instance. The dominant wavelength of this phosphor material is advantageously (excitation wavelength=460 nm) in the range of 572 nm to 575 nm. The colour locus of this phosphor material (not depicted) is advantageously (excitation wavelength=460 nm) in the range of $c_x$=0.453 to 0.469 and $c_y$=0.532 to 0.520. Alternatively or additionally, an $(Lu_{1-y},Y_y)_3(Al_{1-x}Ga_x)_5O_{12}:Ce^{3+}$ or a mixture of a plurality of such phosphors can also be used. The dominant wavelength of the phosphor material is advantageously (excitation wavelength=460 nm) in the range of 558 nm to 562 nm. The colour locus of the phosphor material (not depicted) is then advantageously (excitation wavelength=460 nm) in the range of $c_x$=0.356 to 0.374 and $c_y$=0.561 to 0.573. These materials are mixed for example with one or a plurality of phosphors from these material classes: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$. The dominant wavelength of the nitridic phosphor material is advantageously (excitation wavelength=460 nm) in the range of 590 nm to 615 nm or 596 nm to 604 nm. The colour locus of the nitridic phosphor material is for example (excitation wavelength=460 nm) in the range of $c_x$=0.608 to 0.639 and $c_y$=0.360 to 0.390.

The colour loci A, B, C, D illustrated in the figures can be used in each case with a tolerance of at most 0.05 unit or 0.03 unit with regard to their CIE x-coordinates and CIE y-coordinates in the CIE xy representation, see also the table in FIG. 9. In this respect, the plotting of the colour loci A, B, C, D in the CIE xy diagrams is to scale, in particular in addition to the explanations concerning the further spectral properties given with regard to the respective figures.

Figure 3A:
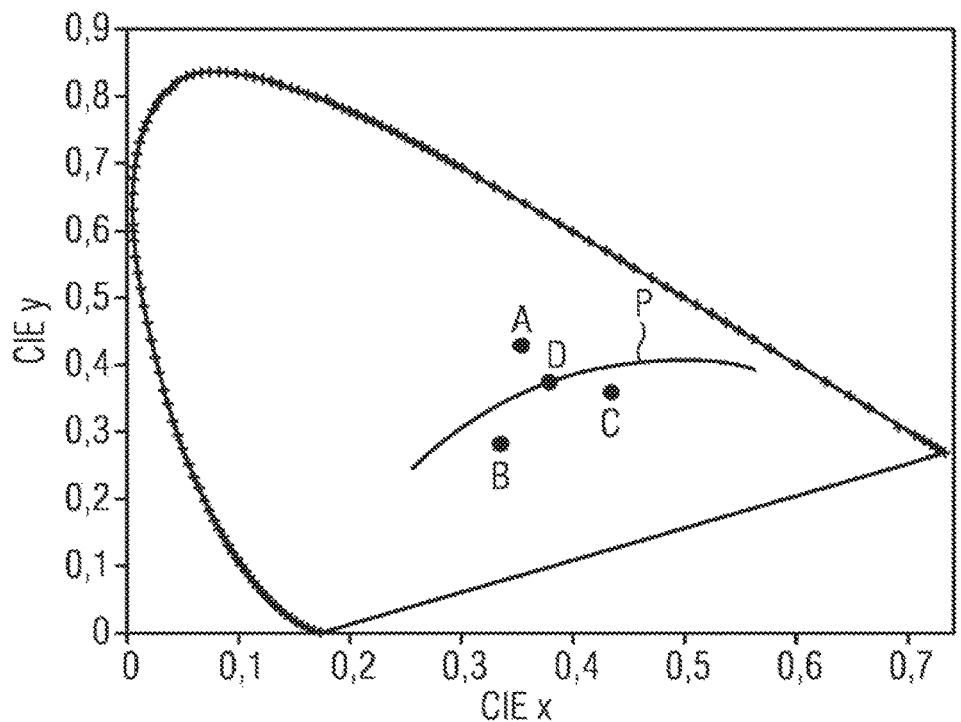
Figure 3B:
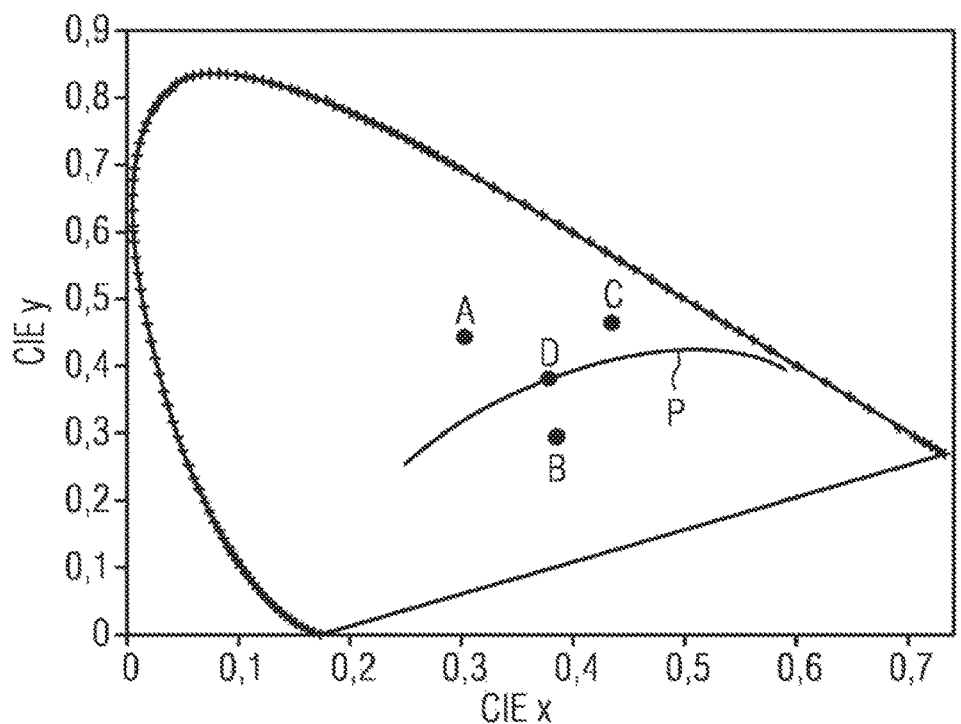

In accordance with FIGS. 3A and 3B, the colour loci A, B, C of three of the light sources lie away from the Planckian locus P and the colour locus D of one of the light sources lies on the Planckian locus P. During operation, the light of the individual light sources is mixed, such that the semiconductor component emits mixed radiation, composed of light from the four light sources.

The colour locus D lies within a triangle spanned by the three colour loci A, B, C lying away from the Planckian locus P. By way of example, it is either possible to choose two colour loci with a smaller $c_y$ and one colour locus with a larger $c_y$ than in the case of the colour locus D on the Planckian locus P. Alternatively, it is also possible for two colour loci to lie at a larger $c_y$ than the colour locus D on the Planckian locus P. One advantage of such a configuration of the colour loci A, B, C, D is that even during the operation of only one light source, in particular that having the colour locus D, a colour locus of the total radiation on the Planckian locus P can be achieved and the emission of white light can thus be operated in a simple manner.

It is possible to attain all the colour loci, in particular all the colour loci on the Planckian locus P, within the triangle spanned by the colour loci A, B, C. The colour locus D on the Planckian locus P is advantageously at at least 2300 K or 3000 K and/or at at most 6000 K or 8500 K. In contrast to the illustration, the colour loci A, B, C not lying on the Planckian locus P can also be situated in regions in the CIE xy diagram which are further away from the colour locus D than depicted. In principle, the colour loci of the points A, B, C can then be chosen arbitrarily. Advantageously, in the exemplary embodiments in FIGS. 3A and 3B, two of the colour loci A, B, C, D lie on a common extension straight line of an isotherm or on a common isotherm.

Figure 4A:
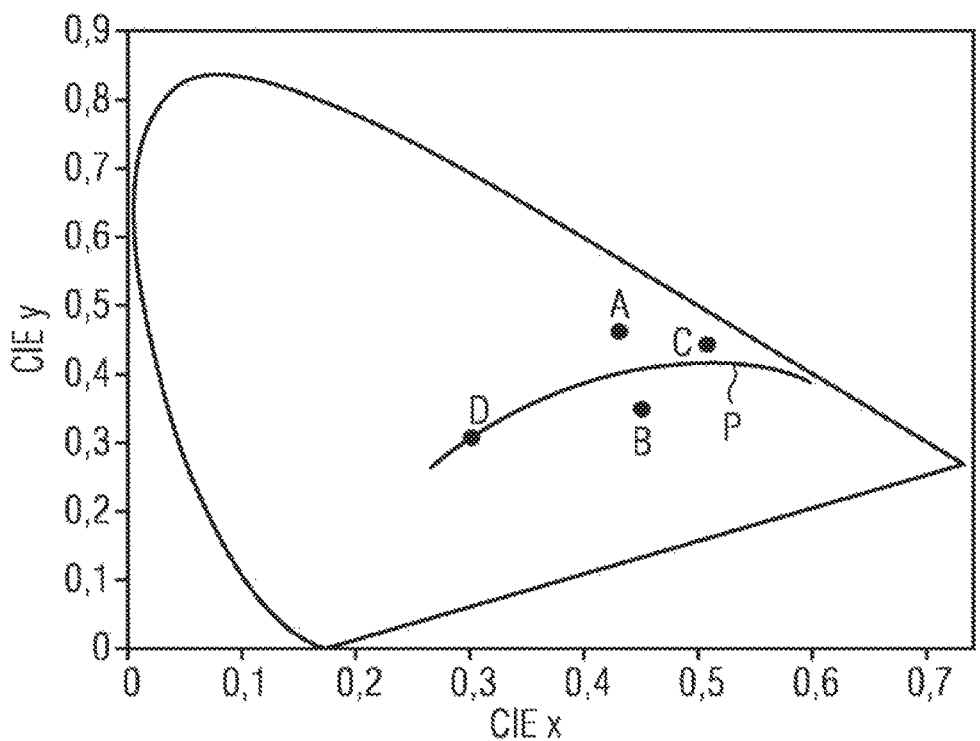
Figure 4B:
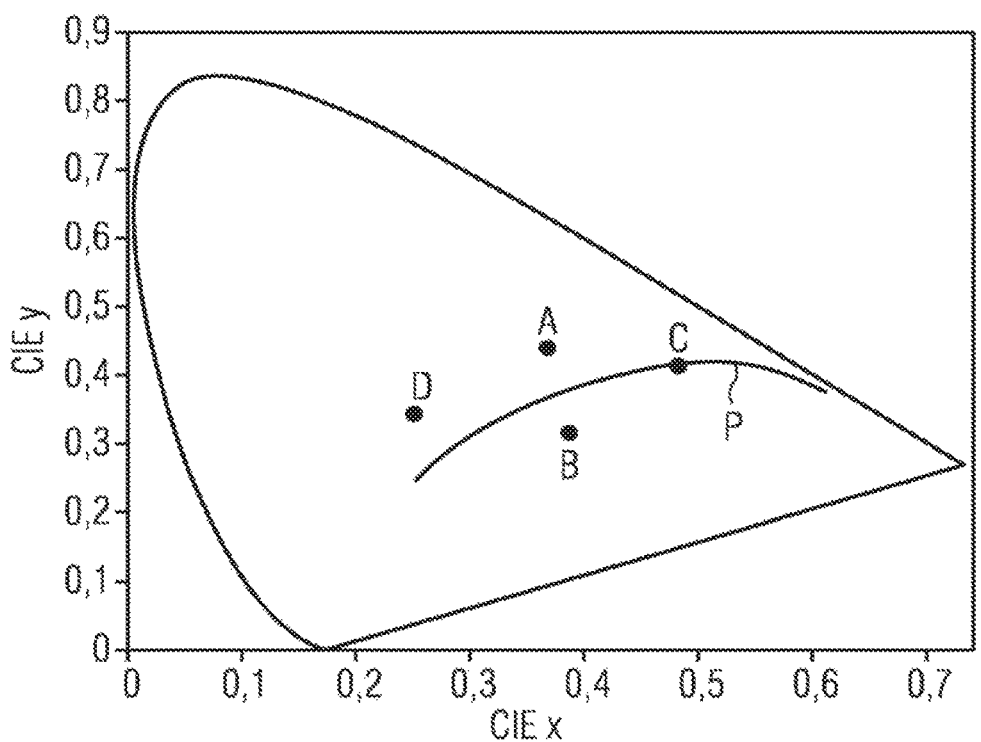

In the embodiments in accordance with FIG. 4, three of the colour loci do not lie on the Planckian locus P, and the fourth colour locus lies on the Planckian locus P. During operation, the light of the individual light sources of the semiconductor component is mixed with one another. In accordance with FIGS. 4A and 4B, two of the colour loci lie above the Planckian locus P, that is to say at larger $c_y$ values, and one of the colour loci lies below the Planckian locus P.

It is also possible for two of the colour loci to lie at a smaller $c_y$ and one colour locus to lie at a larger $c_y$ than the colour locus D on the Planckian locus P, in contrast to the illustration shown in FIGS. 4A and 4B. Likewise, in contrast to the illustration, all three colour loci which do not lie on the Planckian locus P can also lie above or below the Planckian locus P. One advantage of the embodiments in accordance with FIGS. 4A and 4B is that a colour locus on the Planckian locus P can already be achieved during the operation of only one light source.

In joint operation, it is possible to attain all colour loci within the quadrilateral spanned by the four colour loci. The colour locus on the Planckian locus P is advantageously at at least 2300 K or 3000 K and/or at at most 6000 K or 8500 K.

Typical $c_x$-$c_y$-coordinates of the individual colour loci are for example: colour locus A: 0.322/0.336; colour locus B: 0.55/0.24; colour locus C: 0.45/0.47; colour locus D: 0.50/0.35. Typical is understood here to mean for example a deviation +/− of less than 0.05 or 0.03 or 0.01. Colour locus A can be realized for example as a combination of a semiconductor chip that emits blue light with a phosphor mixture, wherein the phosphor mixture, with regard to its wavelength conversion, is advantageously based more than 90% on an $(Lu,Y)_3(Al_{1-x}Y_xGa_x)_5O_{12}:Ce^{3+}$ material or a mixture of a plurality of such materials.

The colour loci B, C, D are advantageously realized by a mixture of one or a plurality of phosphors having a dominant wavelength in the range of 580 nm to 650 nm. Such phosphors can be selected from the following material systems, for instance: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$. The dominant wavelength of the nitridic phosphor material is advantageously (excitation wavelength=460 nm) in the range of 590 nm to 615 nm, particularly advantageously in the range of 596 nm to 604 nm. The colour locus of the nitridic phosphor material (not depicted) is for example (excitation wavelength=460 nm) in the range of $c_x$=0.608 to 0.639 and $c_y$=0.360 to 0.390. Advantageously, these phosphors are additionally mixed with a greenish and/or yellow phosphor selected for example from the following material systems: $(Lu_{1-y},Y_y)_3(Al_{1-x}Ga_x)_5O_{12}:Ce^{3+}$. The dominant wavelength of this phosphor material is advantageously (excitation wavelength=460 nm) in the range of 572 nm to 575 nm. The colour locus of this phosphor material (not depicted) is advantageously (excitation wavelength=460 nm) in the range of $c_x$=0.453 to 0.469 and $c_y$=0.532 to 0.520.

Figure 4C:
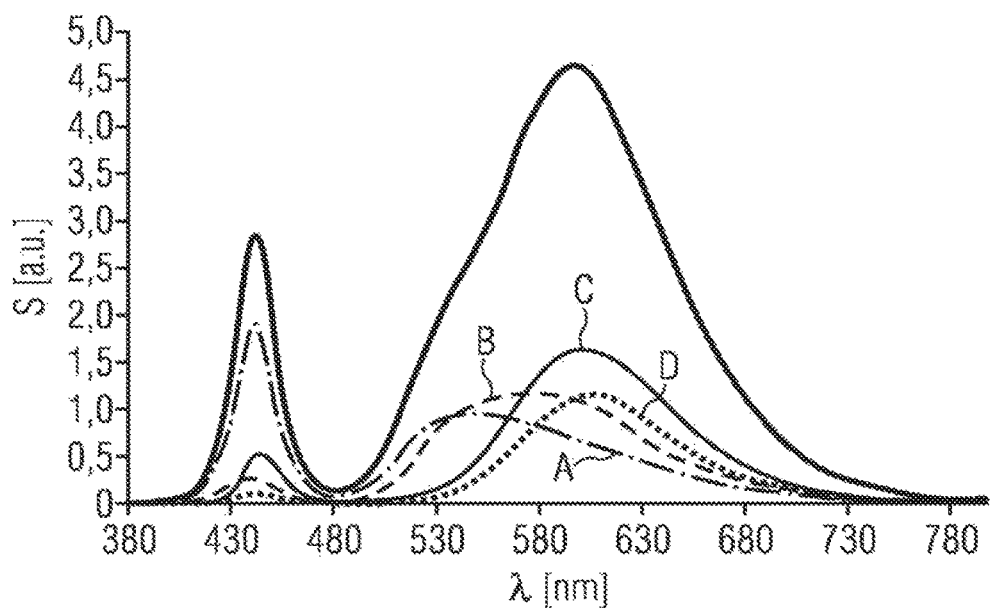

FIG. 4C shows the emission spectra of the light sources with respect to the colour loci A, B, C, D from FIG. 4A.

In the embodiments in FIG. 5, two of four light sources within the semiconductor component have a colour locus different from the Planckian locus P. During operation, the light of the individual light sources is mixed with one another.

By way of example, one colour locus lies at a smaller $c_y$ and one colour locus lies at a larger $c_y$ than one or both light sources having the colour locus on the Planckian locus P. Both colour loci A, B which lie on the extension straight line can in this case have a $c_x$-coordinate between the two colour loci on the Planckian locus P, see FIG. 5A. Likewise, both colour loci A, B which lie on the extension straight line can have a smaller $c_x$, see FIG. 5B. Alternatively, the colour loci A, C which do not lie on the Planckian locus P can also have a larger $c_x$, see FIG. 5C. In FIG. 5C, the two colour loci A, C lie on the extension straight line, wherein the colour locus C also lies on the Planckian locus P.

One advantage of the embodiments in FIG. 5 is that it is possible to attain two different colour loci on the Planckian locus P already during the operation of only one of the light sources. The two colour loci arranged below and/or above the Planckian locus P can then be used for fine tuning of a specific colour locus from the mixture of the two light sources with a colour locus on the Planckian locus P. In joint operation, it is possible to attain all colour loci within the spanned quadrilateral or triangle. The colour loci on the Planckian locus P are advantageously at at least 2000 K and at most 30 000 K or 8500 K. By way of example, one of said colour loci can be in a range of 8500 K to 5000 K inclusive, and the other of these colour loci can be in the range of less than 5000 K to 2000 K.

Figure 5A:
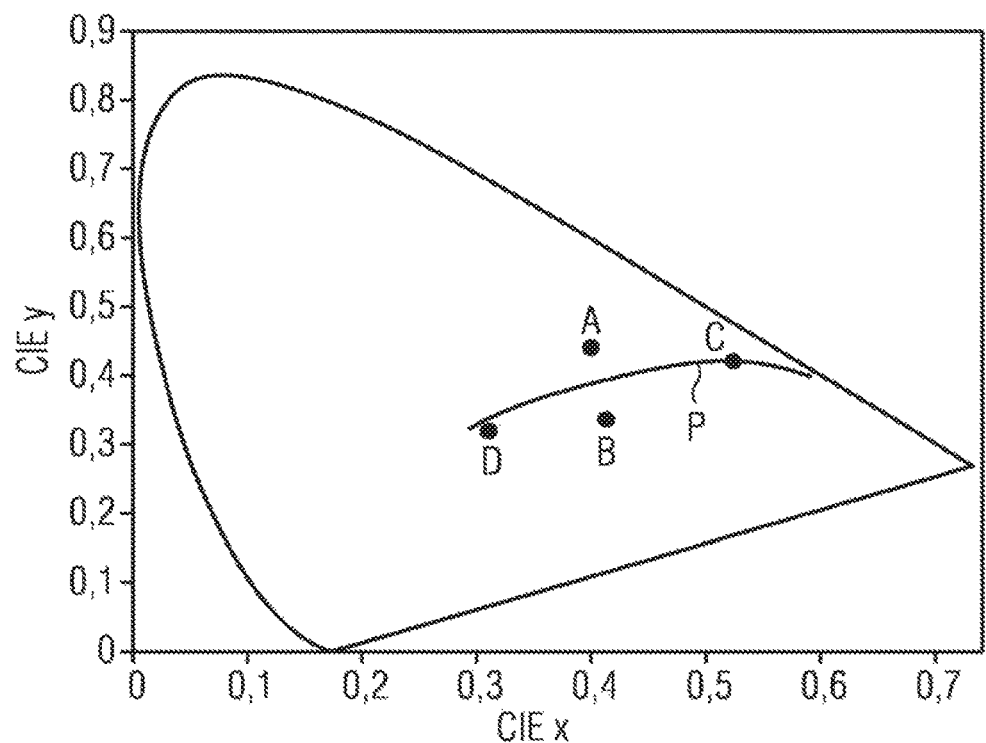
Figure 5B:
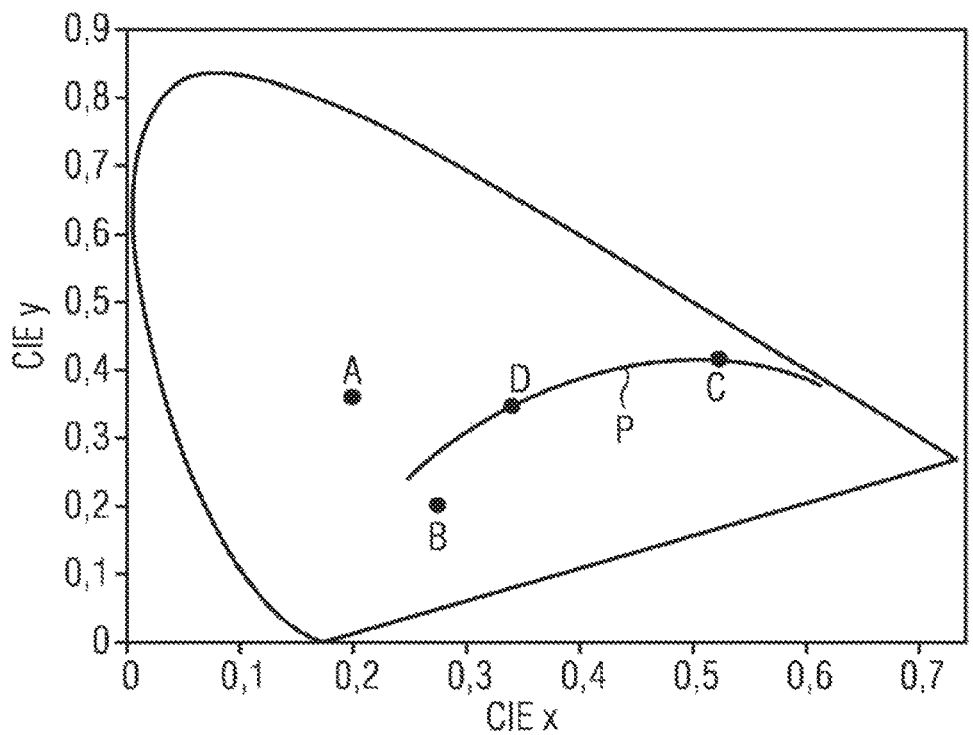
Figure 5C:
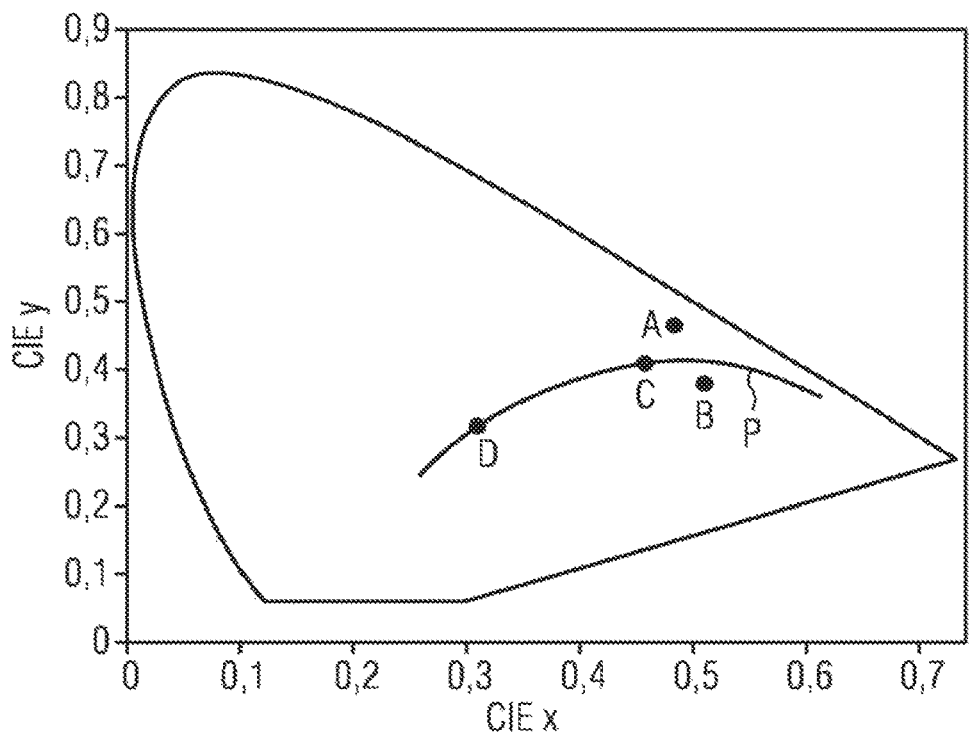

Advantageously, in the embodiments in FIGS. 4A, 4B and 5B, the two middle colour loci A, B with regard to their CIE x-coordinate lie on a common extension straight line of an isotherm or on a common isotherm. Advantageously, the same correspondingly also applies to the colour loci A, B having the smallest CIE x-coordinates in FIG. 5B. In accordance with FIG. 5C, advantageously, the two middle colour loci A, C with regard to their CIE x-coordinate or the two colour loci A, B having the largest CIE x-coordinate lie on a common extension straight line of an isotherm or on a common isotherm.

Figure 6A:
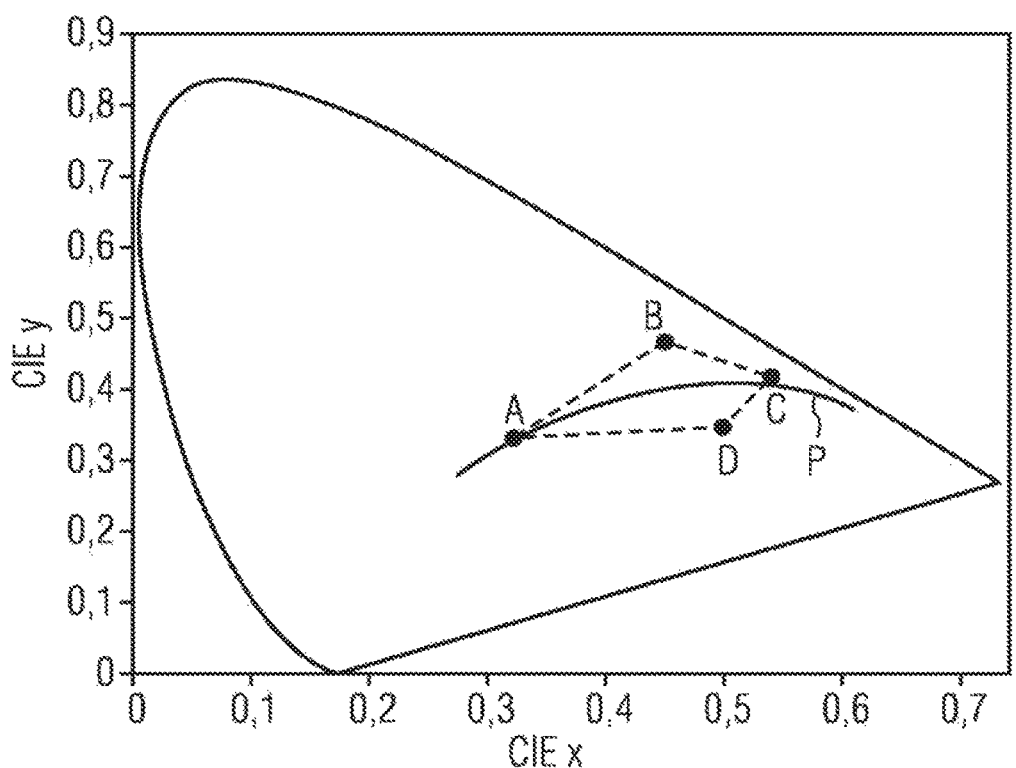

The embodiment as shown in FIG. 6A is analogous to the exemplary embodiment in FIG. 4A. However, the colour locus C is realized with a semiconductor chip having a dominant wavelength of 410 nm. This has the advantage that, as a result of the short-wave light emitted, white surfaces appear more brilliant and appear with a reduced yellow cast to a human observer and in camera recordings. The reason for this is the excitation of molecules and atoms that are luminescent at a short wavelength, that is to say in particular in the spectral range of 380 nm to 550 nm, in white surface materials. $Eu^{2+}$-based phosphors can likewise be efficiently excited at these wavelengths.

As an alternative or in addition to the materials mentioned under FIG. 4 in the case of short-wave excitation, the phosphor material used can advantageously be a mixture of $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$ with $Eu^{2+}$-doped phosphor(s) from the class of the sulphides, the $(Ba,Sr,Ca)Si_2O_2N_2:Eu^{2+}$, the SiAlONs, the nitrido-orthosilicates such as $AE_{2-x-a}RE_xEu_aSi_{1-y}O_{4-x-2y}N_x$ where RE=rare earth metal and AE=alkaline earth metal, the orthosilicates such as $(Ba,Sr,Ca)_2SiO_4:Eu^{2+}$, the chlorosilicates such as $Ca_8Mg(SiO_4)_4Cl_2:Eu^{2+}$ and/or the chlorophosphates.

Figure 6B:
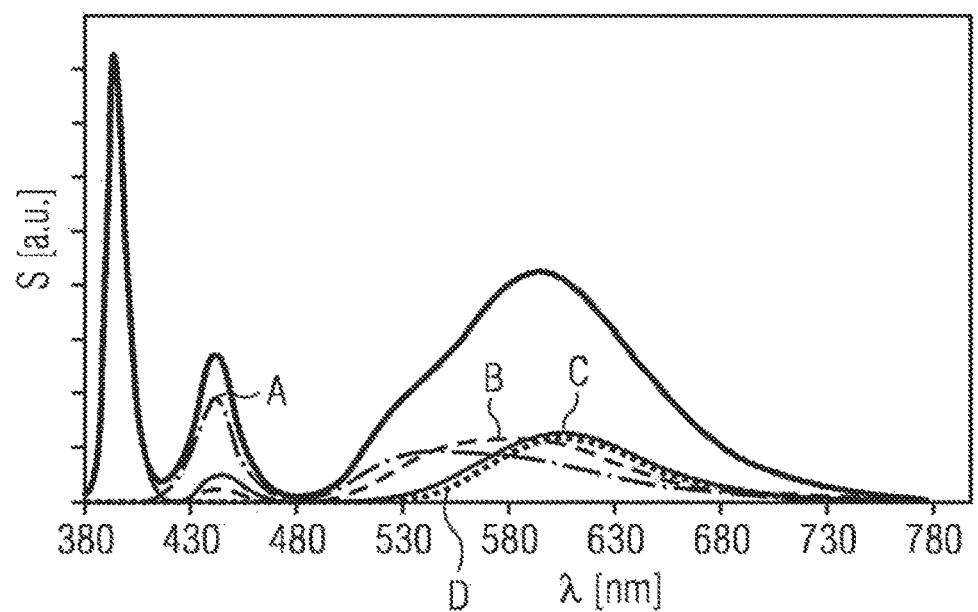

The associated emission spectra of the light sources for the colour loci A, B, C, D are shown in FIG. 6B. In FIG. 6A, the two middle colour loci B, D with regard to their CIE x-coordinate or the two colour loci C, D having the largest CIE x-coordinate can lie on a common extension straight line of an isotherm or on a common isotherm.

Figure 7A:
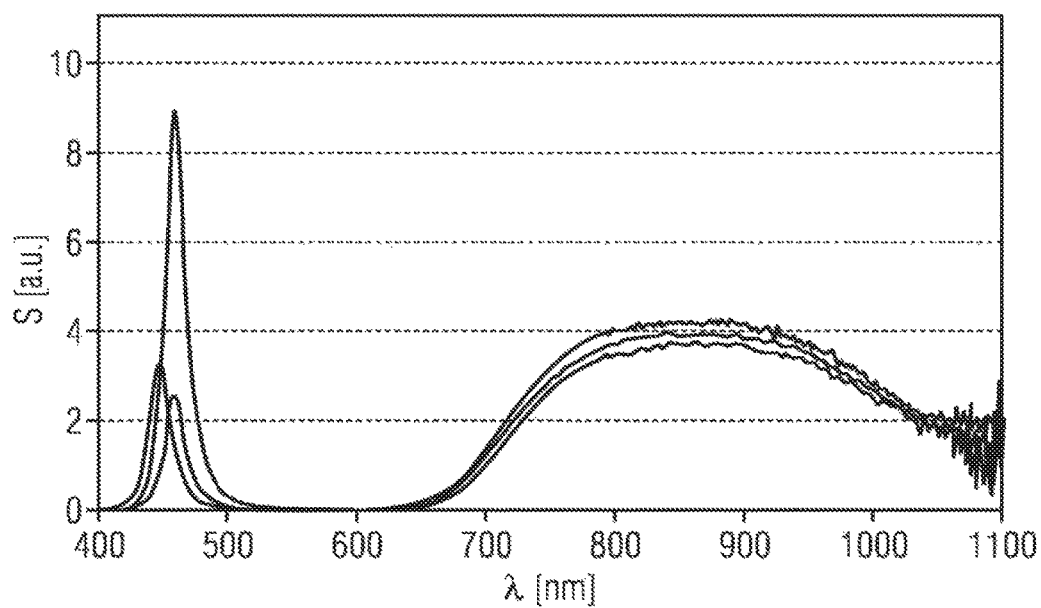
Figure 7B:
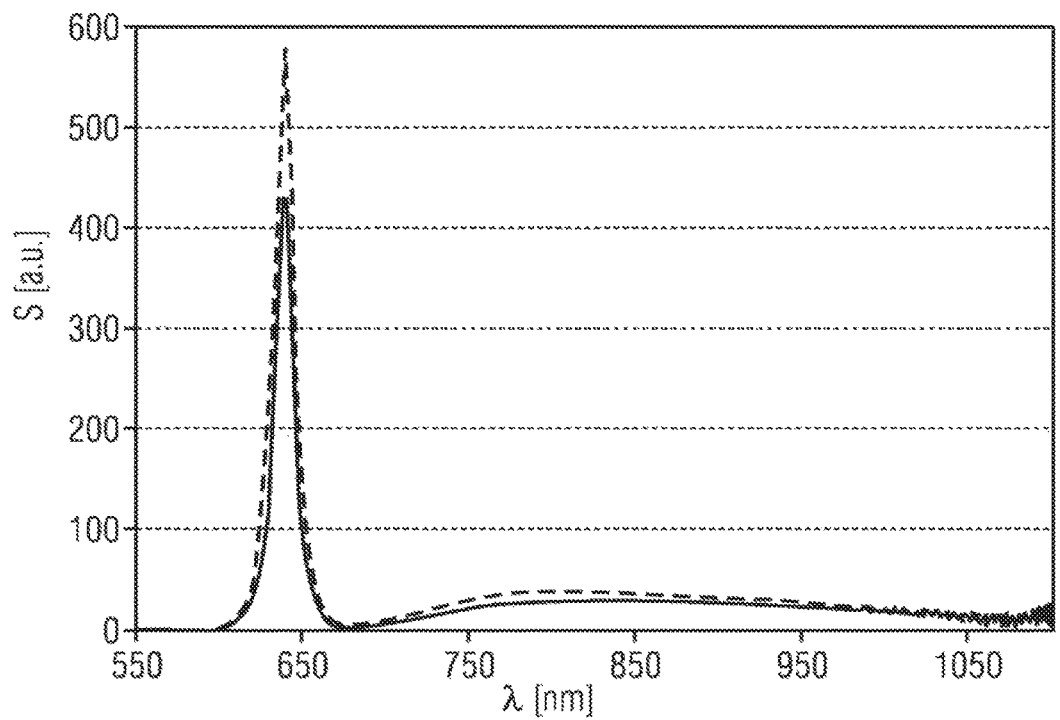

In the embodiment in accordance with FIG. 7, see the emission spectra of one of the light sources in FIGS. 7A and 7B, three of four light sources within the semiconductor component have a colour locus not on the Planckian locus P. The CIE diagram associated with FIG. 7A is illustrated in FIG. 7C, and the CIE diagram associated with FIG. 7B is illustrated in FIG. 7D. The light of the individual light sources is mixed with one another during operation. One of the light sources, see FIGS. 7A and 7B, in this case emits visible and infrared light. The infrared light can either be generated by conversion proceeding from a semiconductor chip which emits in the range of 380 nm to 700 nm (peak wavelength) during operation and is subsequently converted to infrared light by a phosphor. The associated semiconductor chip emits blue light in accordance with FIG. 7A and red light in accordance with FIG. 7B, wherein the infrared phosphor mixture has an emission maximum around 850 nm. Alternatively, the infrared light can be generated directly in the semiconductor chip of the light source or a further light source for infrared light is present.

By way of example, it is possible to choose either two colour loci with a smaller $c_y$ and one colour locus with a larger $c_y$ than the Planckian locus P, or else two colour loci with a larger $c_y$ than the Planckian locus P. In joint operation, it is possible to attain all the colour loci within the spanned triangle or quadrilateral. One advantage of this embodiment is that infrared light in photography, after emission, can be reflected by objects and can be detected again by a detector such as a camera module, as a result of which it is possible to obtain information regarding a three-dimensional arrangement of the photographed objects.

Figure 7C:
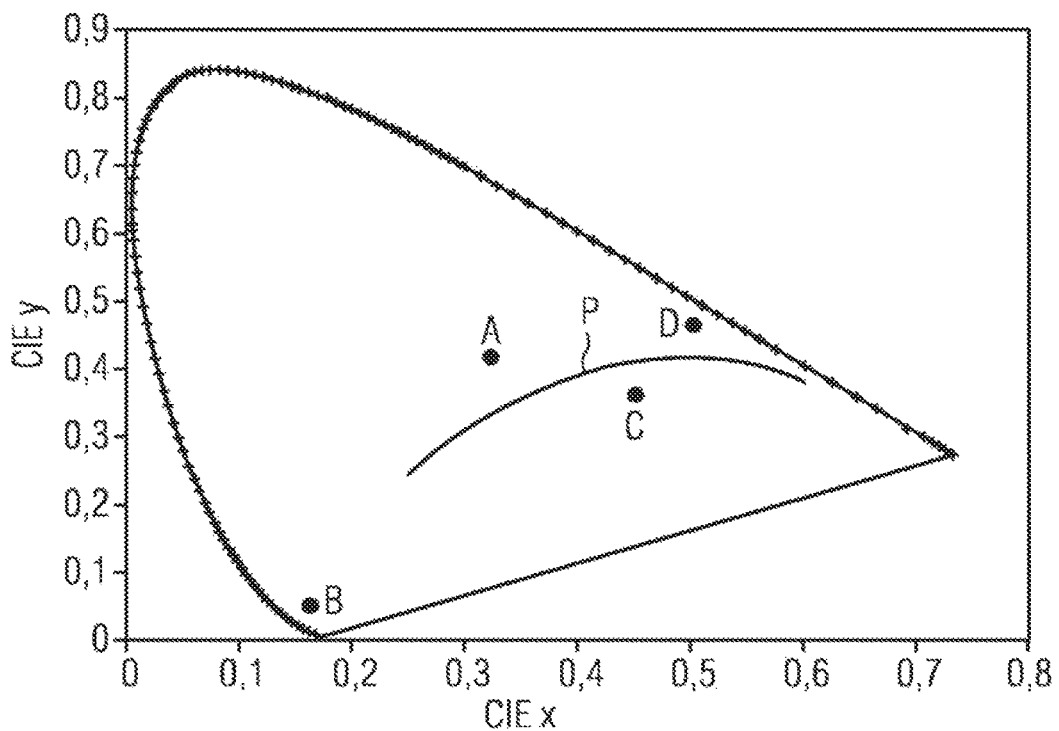
Figure 7D:
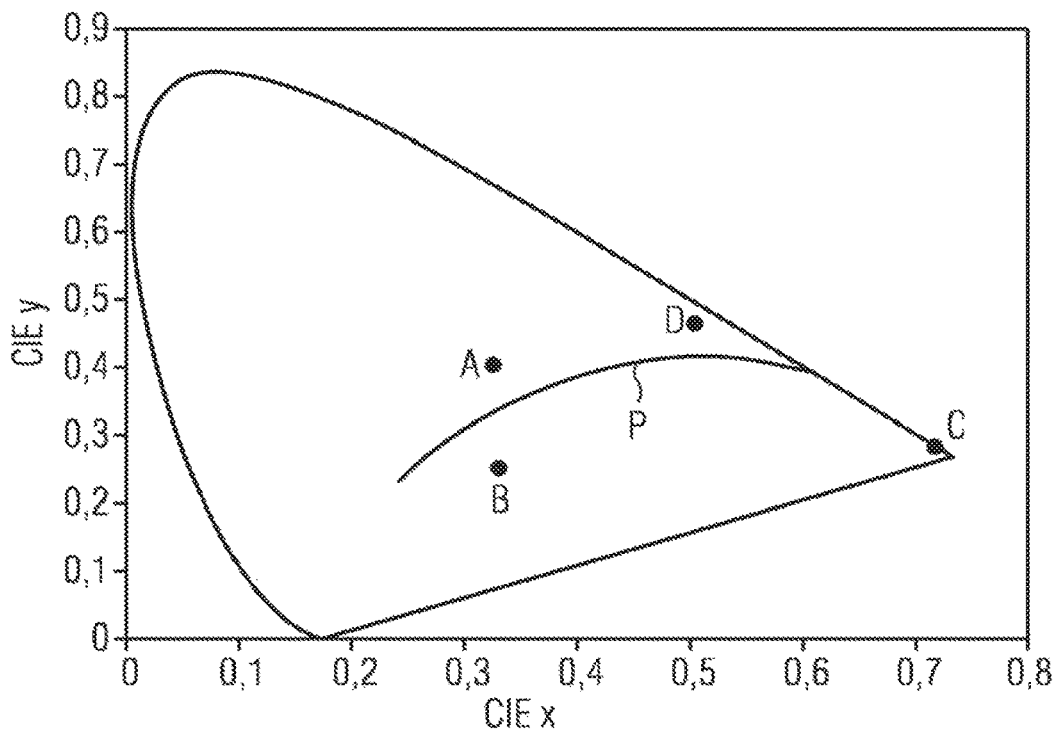

In FIG. 7C, the two middle colour loci A, C with regard to their CIE x-coordinate or the two colour loci C, D having the largest CIE x-coordinate can lie on a common extension straight line of an isotherm or on a common isotherm. The same can correspondingly apply to the two colour loci A, B or to the two colour loci B, D in FIG. 7D.

Figure 8A:
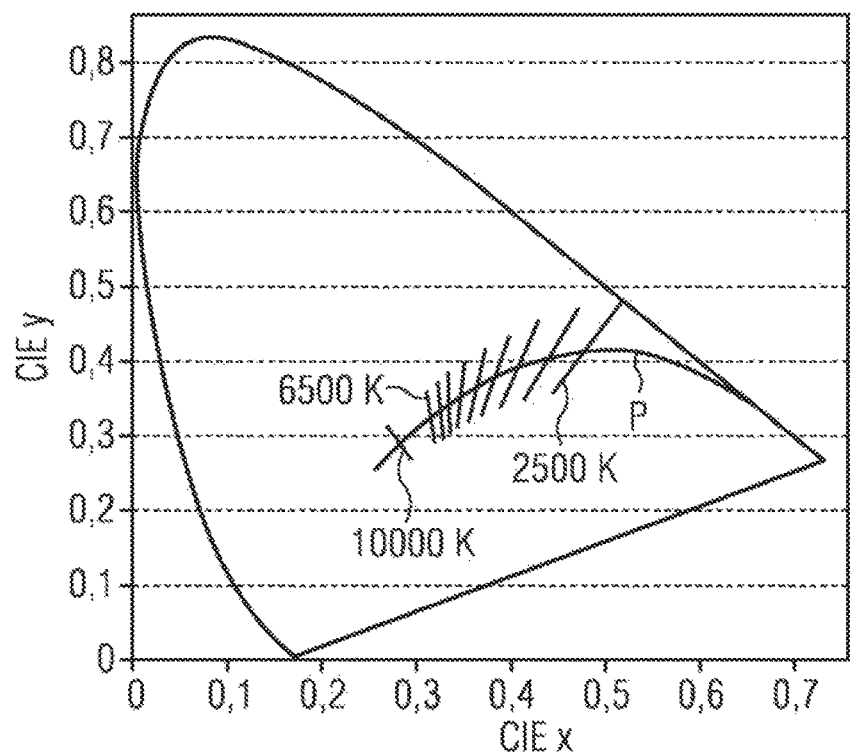
FIG. 8 shows isotherms in CIE diagrams.
Figure 8B:
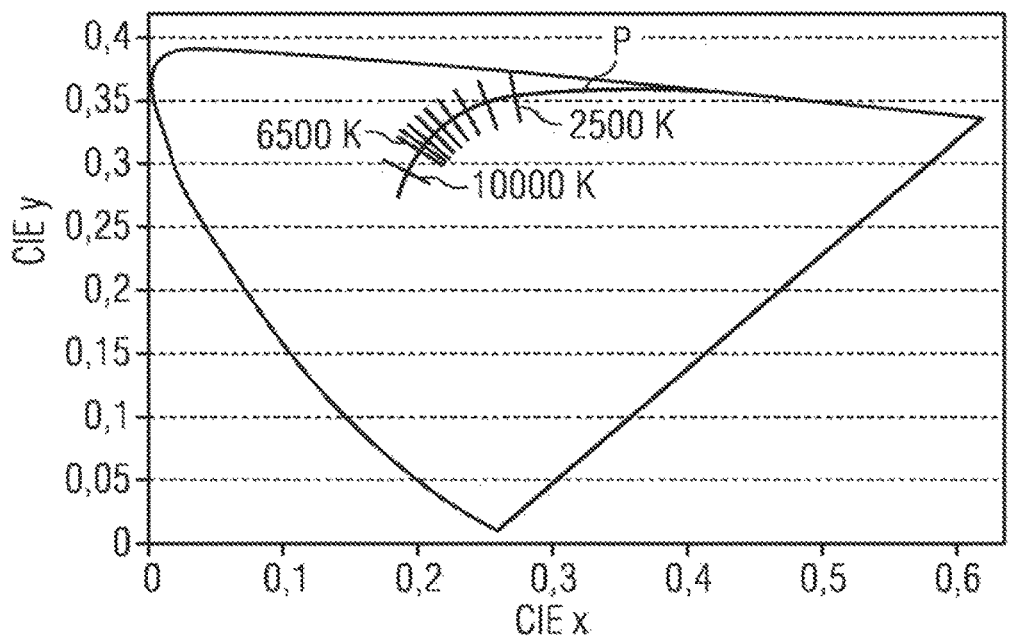

FIG. 8 shows isotherms in CIE diagrams, in CIE xy representation in FIG. 8A and in CIE uv representation in FIG. 8B. The isotherms from 2500 K to 6500 K in steps of 500 K and the isotherm at 10 000 K are shown here. The CIE diagrams can be converted into one another with one-to-one correspondence.

The present disclosure described here is not restricted by the description on the basis of the embodiments. Rather, the present disclosure encompasses any novel feature and also any combination of features, which in particular includes any combination of features in the patent claims, even if this feature or this combination itself is not explicitly specified in the patent claims or embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. Optoelectronic semiconductor component comprising at least four different light sources, each comprising at least one optoelectronic semiconductor chip, which during operation emit radiation having mutually different colour loci in a CIE standard chromaticity diagram, wherein the semiconductor component is designed to emit white or coloured light having a variable correlated colour temperature during operation wherein
the at least one semiconductor chip of each of the four light sources respectively emits blue light and in each case at least one phosphor is disposed downstream of the semiconductor chips of the four light sources and the phosphors are designed in each case only for a partial conversion of radiation emitted by the associated semiconductor chip,
two of the colour loci in the CIE standard chromaticity diagram lie on a common isotherm, with a tolerance of at most one three-step MacAdam ellipse, and
the two remaining colour loci lie on the Planckian locus of the CIE standard chromaticity diagram, with a tolerance of at most 0.015 unit, and another of the colour loci lies above and yet another of the colour loci lies below the Planckian locus in the CIE standard chromaticity diagram, and
the two last-mentioned colour loci are at a distance from the Planckian locus of at least 0.05 unit,
wherein the two colour loci which do not lie on the Planckian locus, with regard to their CIE x-coordinate, lie between the two colour loci on the Planckian locus.

2. Optoelectronic semiconductor component according to claim 1,
wherein a respective phosphor mixture comprising at least one phosphor is disposed downstream of the semiconductor chips of the four light sources and the phosphor mixture is designed only for a partial conversion of radiation emitted by the associated semiconductor chip, and
wherein the semiconductor component emits white light.

3. Optoelectronic semiconductor component according to claim 2,
wherein the two colour loci which are situated on the isotherm or the extension straight line are situated on different sides of the Planckian locus of the CIE standard chromaticity diagram.

4. Optoelectronic semiconductor component according to claim 2,
wherein the four colour loci lie in pairs on isotherms or extension straight lines, with a tolerance of at most one three-step MacAdam ellipse.

5. Optoelectronic semiconductor component according to claim 2,
wherein the two colour loci which are situated on the isotherm or the extension straight line lie equally far away from the Planckian locus with a tolerance of at most one three-step MacAdam ellipse.

6. Optoelectronic semiconductor component according to claim 5,
wherein at least three of the colour loci are at a distance from the Planckian locus of at most 0.04 unit in the CIE standard chromaticity diagram.

7. Optoelectronic semiconductor component according to claim 1,
wherein the two colour loci which do not lie on the Planckian locus lie nearer by least 0.04 unit to the colour locus having the largest CIE x-coordinate than to the colour locus having the smallest CIE x-coordinate.

8. Optoelectronic semiconductor component according to claim 1,
wherein the two colour loci having the largest CIE x-coordinates lie on the Planckian locus, with a tolerance of at most 0.015 unit in the CIE standard chromaticity diagram,
wherein another of the colour loci lies above and yet another of the colour loci lies below the Planckian locus in the CIE standard chromaticity diagram, and the two last-mentioned colour loci are at a distance from the Planckian locus of at least 0.05 unit and additionally have smaller CIE x-coordinates than the two colour loci on the Planckian locus.

9. Optoelectronic semiconductor component according to claim 1, wherein the two colour loci having the smallest CIE x-coordinates lie on the Planckian locus, with a tolerance of at most 0.015 unit in the CIE standard chromaticity diagram, wherein another of the colour loci lies above and yet another of the colour loci lies below the Planckian locus in the CIE standard chromaticity diagram, and the two last-mentioned colour loci are at a distance from the Planckian locus of at least 0.05 unit and additionally have larger CIE x-coordinates than the two colour loci on the Planckian locus.

10. Optoelectronic semiconductor component according to claim 1, wherein a first of the colour loci has a CIE x-coordinate of between 0.20 and 0.30 inclusive and a CIE y-coordinate of between 0.15 and 0.40 inclusive, a second of the colour loci has a CIE x-coordinate of at least 0.45 and a CIE y-coordinate of between 0.25 and 0.38 inclusive, a third of the colour loci has a CIE y-coordinate of at least 0.40 and of at most 0.50, wherein a CIE x-coordinate of the third colour locus lies between the CIE x-coordinates of the first and second colour loci, and a fourth of the colour loci has a CIE x-coordinate which deviates by at most 0.05 from the CIE x-coordinate of the third colour locus, wherein a CIE y-coordinate of the fourth colour locus is smaller than the CIE y-coordinate of the third colour locus by at least 0.04.

11. Optoelectronic semiconductor component according to claim 1, wherein at least three of the light sources are electrically driveable independently of one another, wherein the two light sources having the colour loci lying on the isotherm or the extension straight line are interconnected such that they are operated in each case with at least 75% of a maximum power, and wherein the white light spectrum emitted by the semiconductor component during operation exhibits exactly one intensity maximum in the spectral range of between 480 nm and 700 nm.

12. Optoelectronic semiconductor component according to claim 1, wherein the semiconductor chip of exactly one of the light sources emits near-infrared radiation during operation and this light source has a phosphor for converting the near-infrared radiation into visible light, wherein at least 50% of the radiation power of this light source, measured in W, is at wavelengths of at least 730 nm.

13. Optoelectronic semiconductor component according to claim 1, wherein the semiconductor chip of one of the light sources emits blue or red light during operation and this light source has a phosphor for converting part of the red or blue light into near-infrared radiation, wherein the radiation spectrum generated by the phosphor has an intensity maximum of between 750 nm and 900 nm inclusive.

14. Flashlight incorporated in a portable telecommunications device comprising an optoelectronic semiconductor component according to claim 1.

* * * * *